(12) United States Patent
Hsieh

(10) Patent No.: US 12,306,508 B2
(45) Date of Patent: May 20, 2025

(54) DISPLAY SUBSTRATE, DISPLAY DEVICE, AND MANUFACTURING METHOD

(71) Applicant: BOE TECHNOLOGY GROUP CO., LTD., Beijing (CN)

(72) Inventor: Changhan Hsieh, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/573,588

(22) PCT Filed: Jun. 29, 2021

(86) PCT No.: PCT/CN2021/102994
§ 371 (c)(1),
(2) Date: Dec. 22, 2023

(87) PCT Pub. No.: WO2023/272474
PCT Pub. Date: Jan. 5, 2023

(65) Prior Publication Data
US 2024/0319553 A1 Sep. 26, 2024

(51) Int. Cl.
*G02F 1/1362* (2006.01)
*G02F 1/1337* (2006.01)
(Continued)

(52) U.S. Cl.
CPC .. *G02F 1/136286* (2013.01); *G02F 1/133707* (2013.01); *G02F 1/134318* (2021.01); *G02F 1/134363* (2013.01); *G02F 1/134372* (2021.01); *G02F 1/136209* (2013.01); *G02F 1/136295* (2021.01); *G02F 1/1368* (2013.01); *H10K 10/481* (2023.02)

(58) Field of Classification Search
CPC ............. G02F 1/1368; G02F 1/136286; G02F 1/134318; G02F 1/133707; G02F 1/134372; G02F 1/134363; H10K 10/481
See application file for complete search history.

(56) References Cited

U.S. PATENT DOCUMENTS 5,614,730 A * 3/1997 Nakazawa ............ G02F 1/1362
257/E27.111
2010/0066949 A1* 3/2010 Utsumi ............. G02F 1/133528
349/99
(Continued)

FOREIGN PATENT DOCUMENTS

CN 102779942 A 11/2012
CN 102903675 A 1/2013
(Continued)

*Primary Examiner* — Jia X Pan
(74) *Attorney, Agent, or Firm* — MUNCY, GEISSLER, OLDS & LOWE, P.C.

(57) ABSTRACT

The present disclosure provides a display substrate, a display device, and a manufacturing method. The display substrate includes a base substrate and a plurality of pixels arranged at a side of the base substrate. Each pixel includes: an organic thin film transistor including a gate electrode, an organic semiconductor layer and a source/drain electrode; a first electrode including a plurality of first hollowed-out structures; and an organic protection layer covering the first electrode and the organic thin film transistor and filling the first hollowed-out structures.

13 Claims, 16 Drawing Sheets

(51) Int. Cl.
    *G02F 1/1343*     (2006.01)
    *G02F 1/1368*     (2006.01)
    *H10K 10/46*     (2023.01)

(56) References Cited

U.S. PATENT DOCUMENTS

| | | | |
|---|---|---|---|
| 2011/0013106 A1* | 1/2011 | Liu | H01L 33/44 |
| | | | 438/34 |
| 2012/0298972 A1 | 11/2012 | Zhang et al. | |
| 2013/0228756 A1* | 9/2013 | Lee | H10K 10/474 |
| | | | 438/34 |
| 2013/0306974 A1 | 11/2013 | Park et al. | |
| 2016/0216568 A1 | 7/2016 | Li et al. | |
| 2016/0247839 A1 | 8/2016 | Dai | |
| 2016/0276606 A1* | 9/2016 | Fong | H01L 29/7869 |
| 2017/0115799 A1 | 4/2017 | Shih et al. | |
| 2018/0019312 A1* | 1/2018 | Cheng | H01L 29/66969 |
| 2019/0243190 A1* | 8/2019 | Lee | G02F 1/134363 |
| 2019/0312065 A1* | 10/2019 | Liao | H01L 27/127 |
| 2020/0243566 A1* | 7/2020 | Liu | H01L 27/1218 |
| 2021/0217781 A1* | 7/2021 | Li | H01L 27/1248 |
| 2024/0237367 A1* | 7/2024 | Hsieh | H01L 21/34 |

FOREIGN PATENT DOCUMENTS

| | | |
|---|---|---|
| CN | 103295960 A | 9/2013 |
| CN | 103985716 A | 8/2014 |
| CN | 104597671 A | 5/2015 |
| CN | 104965324 A | 10/2015 |
| CN | 204905257 U | 12/2015 |
| CN | 105287441 A | 7/2018 |
| CN | 110660813 A | 1/2020 |
| KR | 10-2013-0067827 A | 6/2013 |

\* cited by examiner

DISPLAY SUBSTRATE, DISPLAY DEVICE, AND MANUFACTURING METHOD

TECHNICAL FIELD

The present disclosure relates to the field of semiconductor technology, in particular to a display substrate, a display device, and a method for manufacturing the display substrate.

BACKGROUND

Organic thin film transistors are considered to be suitable for a back plate of a flexible liquid crystal display device with a low heat-resistant plastic substrate due to such advantages as excellent bending resistance and low process temperature.

SUMMARY

In one aspect, the present disclosure provides in some embodiments a display substrate, including a base substrate and a plurality of pixels arranged at a side of the base substrate. Each pixel includes: an organic thin film transistor including a gate electrode, an organic semiconductor layer, a source/drain electrode; a first electrode including a plurality of first hollowed-out structures; and an organic protection layer covering the first electrode and the organic thin film transistor, and filling the first hollowed-out structures.

In a possible embodiment of the present disclosure, the pixel includes a second electrode arranged at a side of the organic protection layer away from the first electrode; the first electrode includes a plurality of first electrode strips extending in a first direction and electrically coupled to each other, and the first hollowed-out structure is arranged between adjacent first electrode strips; the second electrode includes a plurality of second electrode strips extending in the first direction and electrically coupled to each other, and a plurality of second hollowed-out structures each arranged between adjacent second electrode strips; and an area of an orthogonal projection of the second hollowed-out structure onto the base substrate is less than an area of an orthogonal projection of the first electrode strip onto the base substrate, and the orthogonal projection of the second hollowed-out structure onto the base substrate is arranged within the orthogonal projection of the first electrode strip onto the base substrate.

In a possible embodiment of the present disclosure, the orthogonal projection of the first electrode strip onto the base substrate overlaps with an orthogonal projection of a part of the second electrode strip at a periphery of the second hollowed-out structure onto the base substrate.

In a possible embodiment of the present disclosure, a line width of the first electrode strip in a direction parallel to a plane where the base substrate is located and perpendicular to the first direction is greater than a width of the second hollowed-out structure in the direction parallel to the plane where the base substrate is located and perpendicular to the first direction.

In a possible embodiment of the present disclosure, the display substrate further includes a gate line electrically coupled to the gate electrode and made of a material different from the gate electrode.

In a possible embodiment of the present disclosure, the display substrate further includes a connection electrode arranged at a same layer as, and insulated from, the second electrode; the gate line is arranged at a side of the connection electrode away from the organic protection layer and is in contact with and electrically coupled to the connection electrode; and the connection electrode is electrically coupled to the gate electrode through a via hole, so that the gate line is electrically coupled to the gate electrode.

In a possible embodiment of the present disclosure, a material of the gate line includes molybdenum (Mo), and a material of the gate electrode includes indium tin oxide (ITO) or indium gallium zinc oxide (IGZO).

In a possible embodiment of the present disclosure, an area of an orthogonal projection of the gate line onto the base substrate is less than an area of an orthogonal projection of the connection electrode onto the base substrate, and the orthogonal projection of the gate line onto the base substrate is arranged within the orthogonal projection of the connection electrode onto the base substrate.

In a possible embodiment of the present disclosure, a line width of the second electrode strip in a direction parallel to a plane where the base substrate is located and perpendicular to the first direction is from 1 μm to 5 μm.

In a possible embodiment of the present disclosure, an area of an orthogonal projection of the first hollowed-out structure onto the base substrate accounts for 20% to 80% of an area of an orthogonal projection of the first electrode onto the base substrate.

In a possible embodiment of the present disclosure, the organic semiconductor layer is arranged at a side of the source electrode and the drain electrode away from the base substrate, and the gate electrode is arranged at a side of the organic semiconductor layer away from the source electrode and the drain electrode; and an organic gate insulation layer is arranged between the gate electrode and the organic semiconductor layer.

In a possible embodiment of the present disclosure, the organic semiconductor layer is arranged at a side of the gate electrode away from the base substrate, and the source/drain electrode is arranged between the organic semiconductor layer and the gate electrode; and an organic gate insulation layer is arranged between the gate electrode and the source/drain electrode.

In a possible embodiment of the present disclosure, an area of an orthogonal projection of the gate electrode onto the base substrate is less than an area of an orthogonal projection of the organic semiconductor layer onto the base substrate, and the orthogonal projection of the gate electrode onto the base substrate is arranged within the orthogonal projection of the organic semiconductor layer onto the base substrate; and the area of the orthogonal projection of the organic semiconductor layer onto the base substrate is substantially equal to an area of an orthogonal projection of the organic gate insulation layer onto the base substrate, and the orthogonal projection of the organic semiconductor layer onto the base substrate substantially coincides with the orthogonal projection of the organic gate insulation layer onto the base substrate.

In a possible embodiment of the present disclosure, the display substrate further includes a planarization layer arranged between the organic thin film transistor and the base substrate, and the planarization layer is in direct contact with the organic protection layer at the first hollowed-out structure.

In a possible embodiment of the present disclosure, the planarization layer includes a first planarization layer and a second planarization layer laminated one on another, the second planarization layer is arranged at a side of the first planarization layer away from the base substrate, and the second planarization layer is in direct contact with the organic protection layer at the first hollowed-out structure.

In a possible embodiment of the present disclosure, the display substrate further includes a shielding layer arranged between the first planarization layer and the second planarization layer, the area of the orthogonal projection of the organic semiconductor layer onto the base substrate is less than an area of an orthogonal projection of the shielding layer onto the base substrate, and the orthogonal projection of the organic semiconductor layer onto the base substrate is arranged within the orthogonal projection of the shielding layer onto the base substrate.

In a possible embodiment of the present disclosure, a material of the shielding layer includes metal or black resin.

In a possible embodiment of the present disclosure, the first electrode is electrically coupled to the source electrode and the drain electrode, the first electrode is a pixel electrode, the second electrode is a common electrode, the first electrode is made of a same material as the second electrode, and the base substrate is an organic flexible base substrate.

In a possible embodiment of the present disclosure, a material of the first electrode includes ITO or IGZO.

In another aspect, the present disclosure provides in some embodiments a display device, including the above-mentioned display substrate, an opposite substrate arranged opposite to the display substrate, and a liquid crystal layer between the display substrate and the opposite substrate.

In yet another aspect, the present disclosure provides in some embodiments a method for manufacturing a display substrate, including: providing a base substrate; forming an organic thin film transistor and a first electrode at a side of the base substrate, the organic thin film transistor including a gate electrode, an organic semiconductor layer, a source/drain electrode, and the first electrode including a plurality of first hollowed-out structures; and forming an organic protection layer which covers the first electrode and the organic thin film transistor, and fills the first hollowed-out structures.

In a possible embodiment of the present disclosure, the forming the organic thin film transistor and the first electrode at a side of the base substrate includes: forming the source electrode and the drain electrode at a side of the base substrate; forming the first electrode including the plurality of the first hollowed-out structures at a side of the source electrode and the drain electrode away from the base substrate; forming the organic semiconductor layer at a side of the first electrode away from the source electrode and the drain electrode; forming an organic gate insulation layer at a side of the organic semiconductor layer away from the first electrode; and forming the gate electrode at a side of the organic gate insulation layer away from the organic semiconductor layer.

In a possible embodiment of the present disclosure, subsequent to forming the organic protection layer which covers the first electrode and the organic thin film transistor and fills the first hollowed-out structure, the method further includes: forming a second thin film layer at a side of the organic protection layer away from the gate electrode; forming a patterned metal layer at a side of the second thin film layer away from the organic protection layer, the patterned metal layer including a first pattern and a gate line; etching the second thin film layer with the patterned metal layer as a mask to form a patterned second electrode and a connection electrode, a pattern of the second electrode being substantially the same as the first pattern, and a pattern of the connection electrode being substantially the same as a pattern of the gate line; and etching off the first pattern.

In a possible embodiment of the present disclosure, the forming the patterned metal layer at a side of the second thin film layer away from the organic protection layer includes forming the patterned metal layer at a side of the second thin film layer away from the organic protection layer through a first wet etching process, the etching the second thin film layer with the patterned metal layer as a mask includes etching the second thin film layer with the patterned metal layer as a mask through a second wet etching process, and the etching off the first pattern includes etching off the first pattern and reserving the gate line through a third wet etching process.

In a possible embodiment of the present disclosure, the etching the second thin film layer with the patterned metal layer as a mask through the second wet etching process includes etching the second thin film layer with the patterned metal layer as a mask through the second wet etching process in such a manner that an area of an orthogonal projection of the second electrode onto the base substrate is less than an area of an orthogonal projection of the first pattern onto the base substrate, the orthogonal projection of the second electrode onto the base substrate is arranged within the orthogonal projection of the first pattern onto the base substrate, an area of an orthogonal projection of the connection electrode onto the base substrate is less than an area of an orthogonal projection of the gate line onto the base substrate, and the orthogonal projection of the connection electrode onto the base substrate is arranged within the orthogonal projection of the gate line onto the base substrate.

In a possible embodiment of the present disclosure, when etching off the first pattern, the method further includes etching a part of the gate line in such a manner that the area of the orthogonal projection of the gate line onto the base substrate is less than the area of the orthogonal projection of the connection electrode onto the base substrate, and the orthogonal projection of the gate line onto the base substrate is arranged within the orthogonal projection of the connection electrode onto the base substrate.

In a possible embodiment of the present disclosure, the forming the organic protection layer which covers the first electrode and the organic thin film transistor and fills the first hollowed-out structures includes: forming the organic protection layer which covers the first electrode and the organic thin film transistor and fills the first hollowed-out structures through spin coating; and UV-curing the organic protection layer and post-baking the organic protection layer at a temperature of 50° C. to 250° C.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

In addition, for clarification, any known functions and members will not be described hereinafter.

For a display substrate including an organic thin film transistor, due to such factors as low process temperature and organic/inorganic interfaces, an adhesive force between the interfaces is insufficient in an actual process, and thereby such a problem as the peeling of a film layer occurs. Hence, it is critical to improve the adhesive force between the film layers at a low process temperature.

In actual use, due to the characteristics of a protection layer (made of an organic material) of the organic thin film transistor and a low film-forming and curing temperature, the peeling defect may easily occur between the protection layer and a first transparent electrode.

Figure 1A:
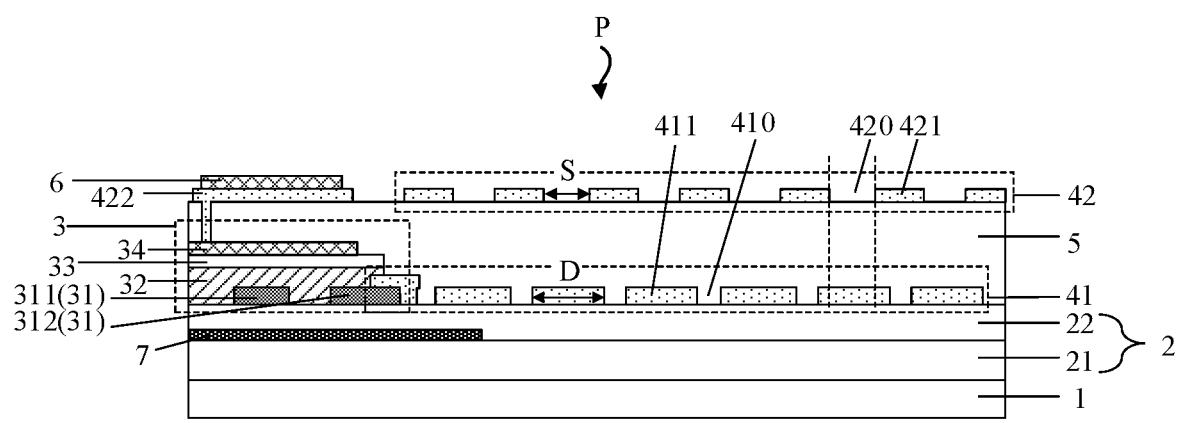
FIG. 1A is a sectional view of a display substrate according to one embodiment of the present disclosure.
Figure 2:
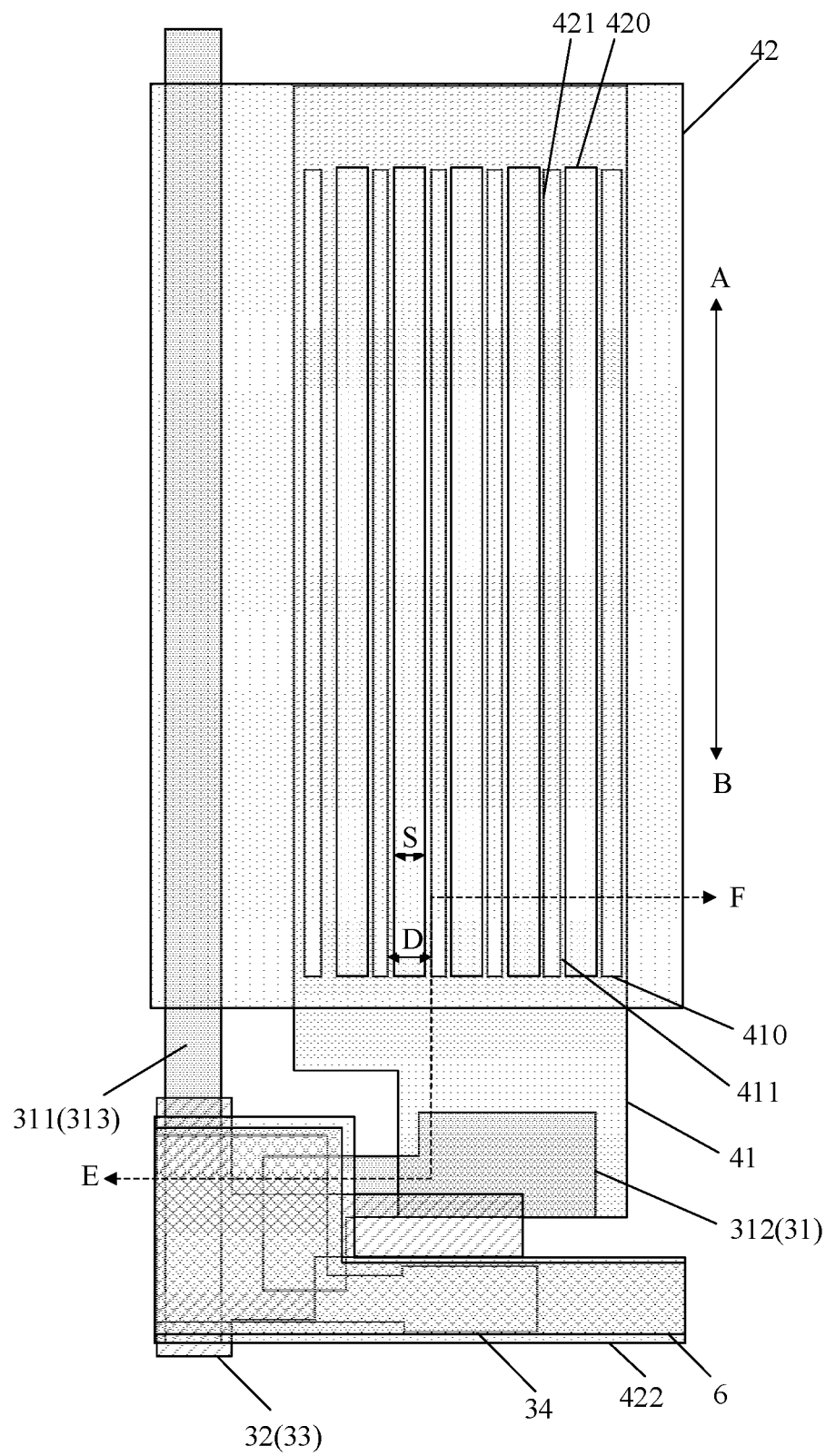
FIG. 2 is a top view of the display substrate according to one embodiment of the present disclosure.
Figure 3:
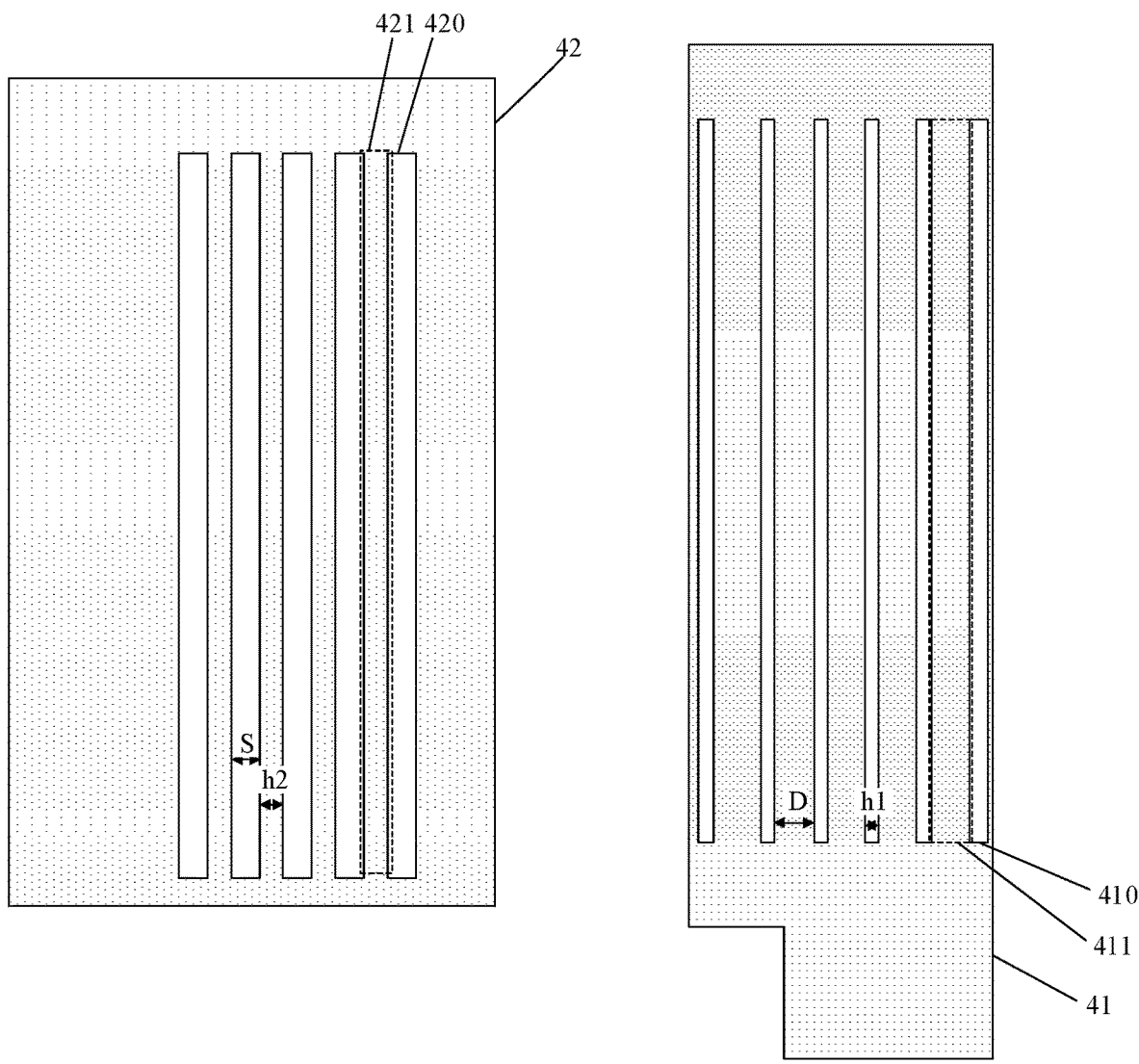
FIG. 3 is a schematic view showing a first electrode and a second electrode according to one embodiment of the present disclosure.

Based on the above, the present disclosure provides in some embodiments a display substrate, as shown in FIG. 1A, FIG. 2 and FIG. 3. FIG. 1A is a sectional view of the display substrate along a dotted line EF in FIG. 2. The display substrate includes a base substrate 1 and a plurality of pixels P arranged at a side of the base substrate 1. Each pixel P includes: an organic thin film transistor 3 including a gate electrode 34, an organic semiconductor layer 33, and a source/drain electrode 31; a first electrode 41 including a plurality of first hollowed-out structures 410; and an organic protection layer 5 covering the first electrode 41 and the organic thin film transistor 3, and filling the first hollowed-out structures 410.

According to the display substrate in the embodiments of the present disclosure, the first electrode 41 is provided with a plurality of first hollowed-out structures 410, the organic protection layer 5 covers the first electrode 41 and the organic thin film transistor 3 and fills the first hollowed-out structures 410, and the first electrode 41 has a concave-convex structure due to the plurality of first hollowed-out structures 410. As a result, it is able to increase a surface roughness of the first electrode 41, reduce a proportion of an interface between the organic protection layer 5 and the inorganic first electrode 41, increase the adhesion between the first electrode 41 and the organic protection layer 5, thereby to prevent the organic protection layer 5 from being separated from, or peeled off from, the first electrode 41.

In a possible embodiment of the present disclosure, a material of the organic protection layer 5 is propylene glycol methyl ether acetate or photosensitive resin.

In a possible embodiment of the present disclosure, as shown in FIG. 1A, FIG. 2 and FIG. 3, the pixel P includes a second electrode 42 arranged at a side of the organic protection layer 5 away from the first electrode 41. The first electrode 41 includes a plurality of first electrode strips 411 extending in a first direction AB and electrically coupled to each other, and each first hollowed-out structure 410 is arranged between adjacent first electrode strips 411. The second electrode 42 includes a plurality of second electrode strips 421 extending in the first direction AB and electrically coupled to each other and a plurality of second hollowed-out structures 420, and each second hollowed-out structure 420 is arranged between adjacent second electrode strips 421. An area of an orthogonal projection of the second hollowed-out structure 420 onto the base substrate 1 is less than an area of an orthogonal projection of the first electrode strip 411 onto the base substrate 1, and the orthogonal projection of the second hollowed-out structure 420 onto the base substrate 1 is arranged within the orthogonal projection of the first electrode strip 411 onto the base substrate 1.

It should be appreciated that, the first electrode strip 411 extends, but not limited to, in the first direction AB in FIG. 2 and FIG. 3. For example, the first electrode strip 411 is of a curved shape, i.e., the first electrode strip 411 includes a portion extending in the first direction AB and a portion extending in a second direction, and an included angle between the first direction AB and the second direction is not equal to 0 or 180°. Similarly, the second electrode strip 421 extends, but not limited to, in the first direction AB in FIG. 2 and FIG. 3. For example, the second electrode strip 421 is of a curved shape, i.e., the second electrode strip 421 includes a portion extending in the first direction AB and a portion extending in the second direction, and an included angle between the first direction AB and the second direction is not equal to 0 or 180°. At this time, the first hollowed-out structure 410 and the second hollowed-out structure 420 still meet the above-mentioned requirement.

Figure 4:
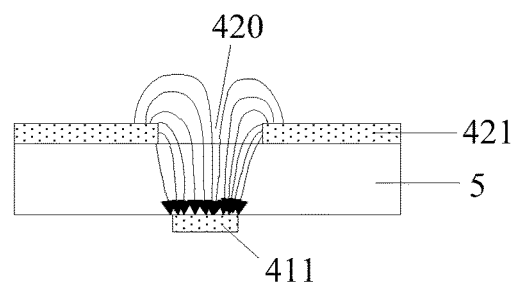
FIG. 4 is a schematic view showing an electric field when an line width of a first electrode strip is less than a width of a second hollowed-out structure.
Figure 5:
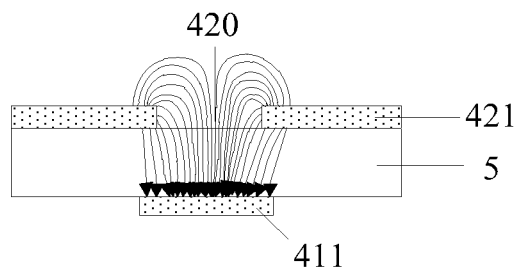
FIG. 5 is a schematic view showing the electric field when the line width of the first electrode strip is greater than the width of the second hollowed-out structure.
Figure 6:
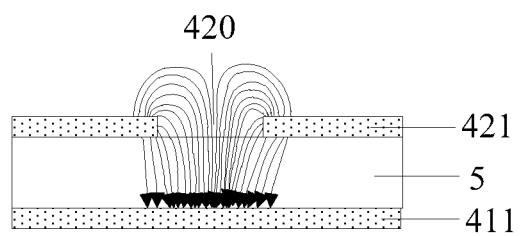
FIG. 6 is a schematic view showing the electric field when the first electrode is not provided with a first hollowed-out structure.

During the implementation, as compared with the structure in FIG. 4 where the area of the orthogonal projection of the second hollowed-out structure 420 onto the base substrate 1 is greater than the area of the orthogonal projection of the first electrode strip 411 onto the base substrate 1 and the orthogonal projection of the first electrode strip 411 onto the base substrate 1 is arranged within the orthogonal projection of the second hollowed-out structure 420 onto the base substrate 1, for the structure in FIG. 5, the area of the orthogonal projection of the second hollowed-out structure 420 onto the base substrate 1 is less than the area of the orthogonal projection of the first electrode strip 411 onto the base substrate 1, and the orthogonal projection of the second hollowed-out structure 420 onto the base substrate 1 is arranged within the orthogonal projection of the first electrode strip 411 onto the base substrate 1, so an electric field generated by the structure is equivalent to an electric field generated when the first electrode 41 is not provided with the first hollowed-out structure 410 (as shown in FIG. 6), that is, a strong active electric field is generate so as to control the deflection of liquid crystals.

In a possible embodiment of the present disclosure, as shown in FIG. 1A, FIG. 2 and FIG. 5, the orthogonal projection of the first electrode strip 411 onto the base substrate 1 overlaps with an orthogonal projection of a part of the second electrode strip 421 at a periphery of the second hollowed-out structure 420 onto the base substrate 1.

In a possible embodiment of the present disclosure, as shown in FIG. 1A, FIG. 2 and FIG. 5, a line width D of the first electrode strip 411 in a direction parallel to a plane where the base substrate is located 1 and perpendicular to the first direction AB is greater than a width S of the second hollowed-out structure 420 in the direction parallel to the plane where the base substrate is located 1 and perpendicular to the first direction AB.

During the implementation, as shown in FIG. 1A, FIG. 2, FIG. 3 and FIG. 5, a part of the first electrode 41 is hollowed out to form the first hollowed-out structure 410, and a region between adjacent first hollowed-out structures 410 is the first electrode strip 411. The first hollowed-out structure 410 is of a strip-like shape and arranged between two adjacent first electrode strips 411. To be specific, as shown in FIG. 1A, FIG. 2, FIG. 3 and FIG. 5, in the same first electrode 41, the first hollowed-out structures 410 and the first electrode strips 411 are arranged alternately, widths h1 of the first hollowed-out structures 410 in the direction parallel to the plane where the base substrate is located 1 and perpendicular to the first direction AB are equal to each other, and line widths D of the first electrode strips 411 in the direction parallel to the plane where the base substrate is located 1 and perpendicular to the first direction AB are equal to each other. The line width D of each first electrode strip 411 in the direction parallel to the plane where the base substrate is located 1 and perpendicular to the first direction AB is greater than the width h1 of each first hollowed-out structure 410 in the direction parallel to the plane where the base substrate is located 1 and perpendicular to the first direction AB. In the same second electrode 42, the second hollowed-out structures 420 and the second electrode strips 421 are arranged alternately, widths S of the second hollowed-out structures 420 in the direction parallel to the plane where the base substrate is located 1 and perpendicular to the first direction AB are equal to each other, and line widths h2 of the second electrode strips 421 in the direction parallel to the plane where the base substrate is located 1 and perpendicular to the first direction AB are equal to each other. The line width h2 of each second electrode strip 421 in the direction parallel to the plane where the base substrate is located 1 and perpendicular to the first direction AB is less than the width S of each second hollowed-out structure 420 in the direction parallel to the plane where the base substrate is located 1 and perpendicular to the first direction AB. The line width D of each first electrode strip 411 in the direction parallel to the plane where the base substrate is located 1 and perpendicular to the first direction AB is greater than the line width h2 of each second electrode strip 421 in the direction parallel to the plane where the base substrate is located 1 and perpendicular to the first direction AB, and the width h1 of each first hollowed-out structure 410 in the direction parallel to the plane where the base substrate is located 1 and perpendicular to the first direction AB is less than the width S of each second hollowed-out structure 420 in the direction parallel to the plane where the base substrate is located 1 and perpendicular to the first direction AB.

In a possible embodiment of the present disclosure, as shown in FIG. 1A and FIG. 2, the display substrate further includes a gate line 6 electrically coupled to the gate electrode 34, and the gate line 6 and the gate electrode 34 are made of different materials. To be specific, a material of the gate electrode 34 includes ITO or IGZO, and a material of the gate line 6 includes Mo, a material of the source/drain electrode 31 includes Argentum (Ag). The materials of the organic semiconductor layer 32 and the organic gate insulation layer 33 include non-crosslinked materials. In the embodiments of the present disclosure, the gate line 6 and the gate electrode 34 are made of different materials, so as to prevent the source/drain electrode 31 from being corroded by a Mo etching solution when etching the gate electrode 34, thereby to prevent a pattern of the source/drain electrode 31 from being adversely affected. When the gate line 6 and the gate electrode 34 are made of different materials, e.g., the gate line 6 is made of Mo and the gate electrode 34 is made of ITO, the etching solution for etching the gate electrode 34 does not corrode the source/drain electrode 31, so the pattern of the source/drain electrode 31 is not adversely affected. That is, the material of the source/drain electrode 31 includes Ag and the material of the gate line 6 includes Mo, and when the material of the gate electrode 34 includes Mo, the Mo etching solution may corrode Ag, so the gate electrode 34 should be made of a material so that the source/drain electrode 31 is not corroded by a wet etching solution. For the sake of line resistance, the material of the gate line 6 includes Mo without any special requirements. To be specific, an organic semiconductor film layer, an organic gate insulation film layer and a gate thin film layer are formed in sequence. Then, the gate electrode 34 is patterned through a wet etching process, and the organic semiconductor layer 32 and the organic gate insulation layer 33 are patterned through a photolithography process and a dry etching process. To be specific, a pattern of the organic semiconductor layer 32 is substantially the same as a pattern of the organic gate insulation layer 33.

In a possible embodiment of the present disclosure, as shown in FIG. 1A and FIG. 2, the display substrate further includes a connection electrode 422 arranged at a same layer as, and insulated from, the second electrode 42. The gate line 6 is arranged at a side of the connection electrode 422 away from the organic protection layer 5 and is in contact with and electrically coupled to the connection electrode 422. The connection electrode 422 is electrically coupled to the gate electrode 34 through a via hole, and the gate line 6 is electrically coupled to the gate electrode 34.

In a possible embodiment of the present disclosure, a material of the organic semiconductor layer 32 includes a polyacetylene material, a polyaromatic ring material, or a copolymer material.

In a possible embodiment of the present disclosure, a material of the organic gate insulation layer 33 includes a polymer insulation material. To be specific, the material of the organic gate insulation layer 33 includes Polyvinyl alcohol (PVA), Polyvinyl chloride (PVC), Polyvinyl pyrrolidone (PVP), Polymethyl methacrylate (PMMA), or Polystyrene (PS).

Figure 7:
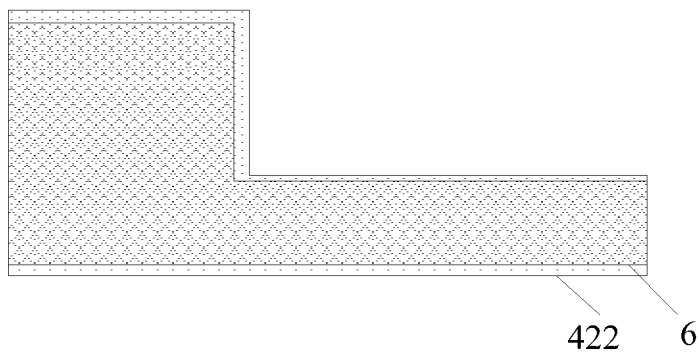
FIG. 7 is a schematic view showing a relationship between a gate line and a connection electrode according to one embodiment of the present disclosure.

In a possible embodiment of the present disclosure, as shown in FIG. 2 and FIG. 7, an area of an orthogonal projection of the gate line 6 onto the base substrate 1 is less than an area of an orthogonal projection of the connection electrode 422 onto the base substrate 1, and the orthogonal projection of the gate line 6 onto the base substrate 1 is arranged within the orthogonal projection of the connection electrode 422 onto the base substrate 1. In the embodiments of the present disclosure, when the area of the orthogonal projection of the gate line 6 onto the base substrate 1 is less than the area of the orthogonal projection of the connection electrode 422 onto the base substrate 1, and the orthogonal projection of the gate line 6 onto the base substrate 1 is arranged within the orthogonal projection of the connection electrode 422 onto the base substrate 1, it is able to prevent the occurrence of water vapor or gas in a region below an extended portion of gate line 6 (Mo) relative to the connection electrode 422 (ITO) when the pattern of the connection electrode 422 (ITO) is less than or equal to the pattern of the gate line 6 (Mo).

Figure 21:
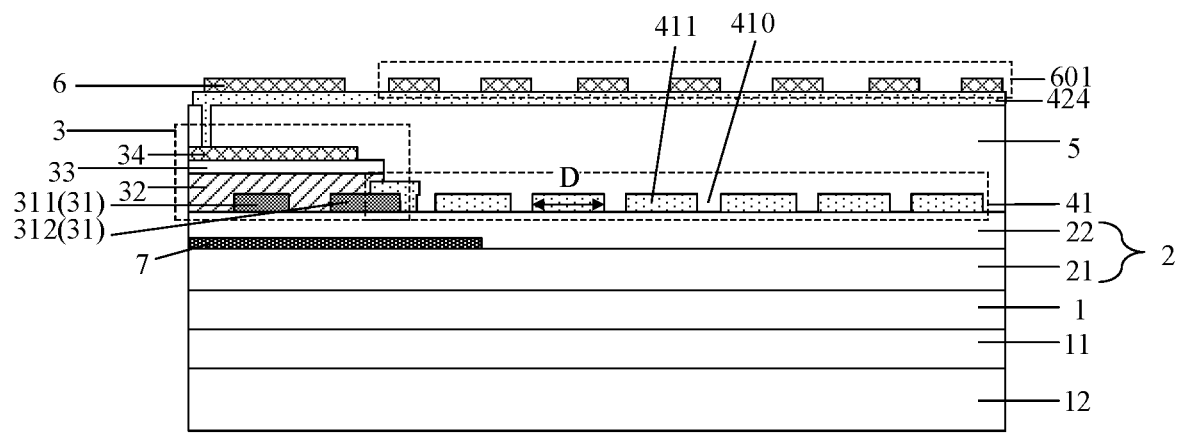
FIG. 21 is a sectional view of the display substrate after the formation of the gate line and a first pattern according to one embodiment of the present disclosure.
Figure 22:
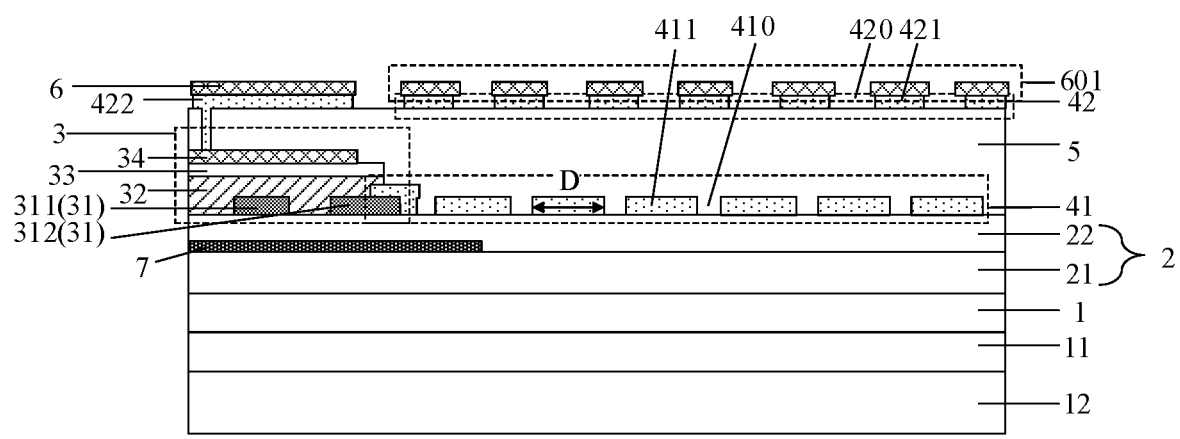
FIG. 22 is a sectional view of the display substrate when the second electrode is etched through the first pattern according to one embodiment of the present disclosure.
Figure 23:
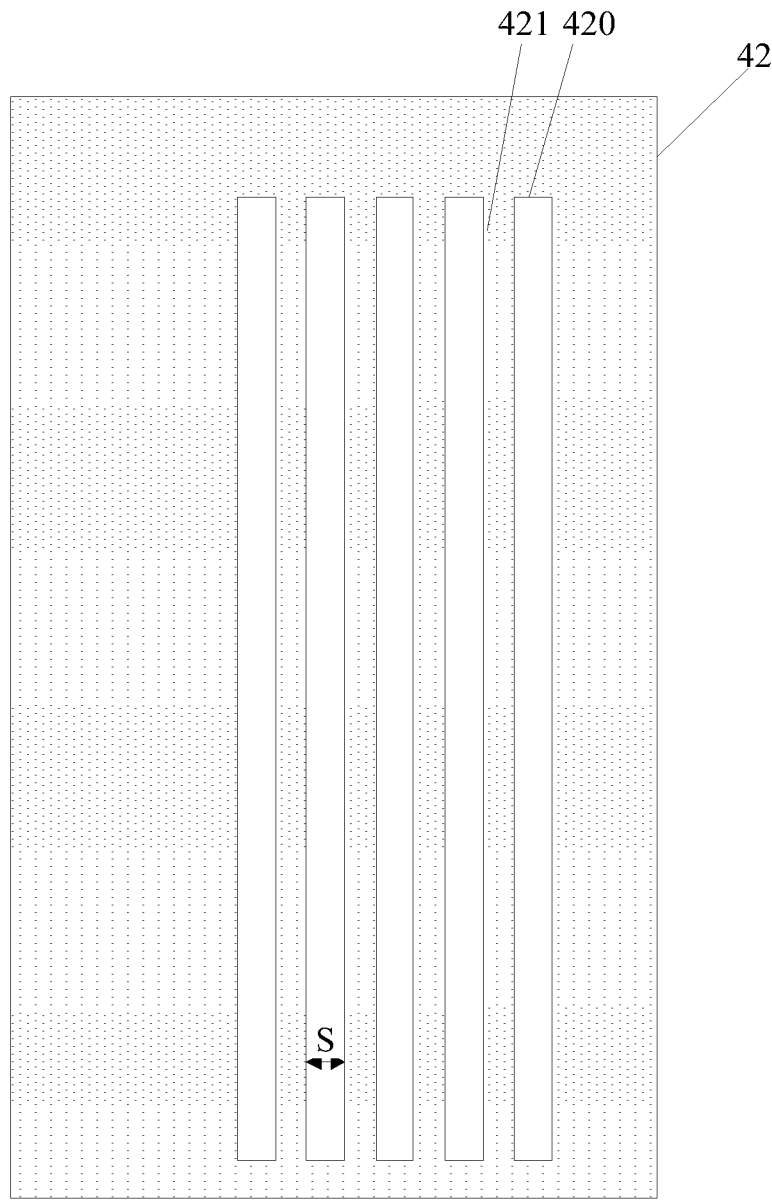
FIG. 23 is a top view of the second electrode according to one embodiment of the present disclosure.
Figure 23:
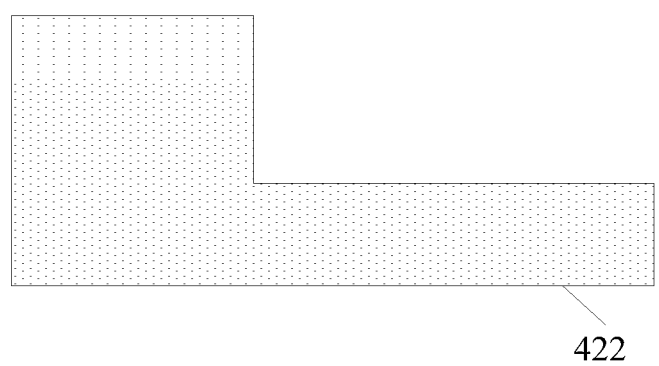

In a possible embodiment of the present disclosure, the line width h2 of the second electrode strip 421 in the direction parallel to a plane where the base substrate is located 1 and perpendicular to the first direction AB is from 1 μm to 5 μm. To be specific, the line width h2 of the second electrode strip 421 in the direction parallel to the plane where the base substrate is located 1 and perpendicular to the first direction AB is from 1 μm to 3 μm, 1 μm to 2 μm, or 1 μm to 1.5 μm, e.g., 1 μm or 5 μm. In the embodiments of the present disclosure, when the line width h2 of the second electrode strip 421 in the direction parallel to the plane where the base substrate is located 1 and perpendicular to the first direction AB is from 1 μm to 5 μm, it is able to form a strong electric field between the second electrode 42 and the first electrode 41 as compared with the electric field generated when the line width h2 of the second electrode strip 421 in the direction parallel to the plane where the base substrate is located 1 and perpendicular to the first direction AB is too wide. In the embodiments of the present disclosure, as shown in FIG. 21 and FIG. 22, a metal layer is etched to form the gate line 6 and a first pattern 601 which is substantially the same as the pattern of the second electrode 42, and then the second electrode 42 is formed through etching with the first pattern 601 as a mask, so as to reduce the line width h2 of the second electrode strip 421 in the direction parallel to the plane where the base substrate is located 1 and perpendicular to the first direction AB. When the etching is performed without the first pattern as a mask, the line width h2 of the second electrode strip 421 in the direction parallel to the plane where the base substrate is located 1 and perpendicular to the first direction AB is from 4 μm to 5 μm.

In a possible embodiment of the present disclosure, an area of an orthogonal projection of the first hollowed-out structure 410 onto the base substrate 1 accounts for 20% to 80% of an area of an orthogonal projection of the first electrode 41 onto the base substrate 1.

In a possible embodiment of the present disclosure, as shown in FIG. 1A, the organic thin film transistor 3 is a top-gate thin film transistor. To be specific, the organic semiconductor layer 32 is arranged at a side of the source/drain electrode 31 away from the base substrate 1, the gate electrode 34 is arranged at a side of the organic semiconductor layer 32 away from the source/drain electrode 31, and an organic gate insulation layer 33 is arranged between the gate electrode 34 and the organic semiconductor layer 32. During the implementation, the organic semiconductor layer 32 may not withstand the bombardment during the sputtering, the organic thin film transistor 3 is of a top-gate bottom-contact structure or a bottom-gate bottom-contact structure, and the former has better carrier transmission efficiency. In the embodiments of the present disclosure, the display substrate includes the top-gate bottom-contact organic thin film transistors.

Figure 1B:
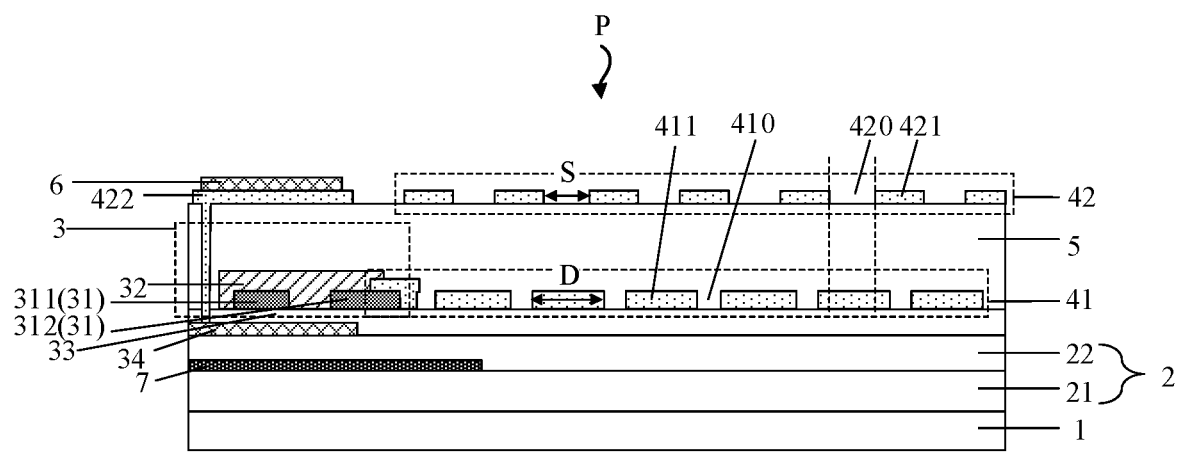
FIG. 1B is another sectional view of the display substrate according to one embodiment of the present disclosure.

In a possible embodiment of the present disclosure, as shown in FIG. 1, the organic thin film transistor 3 is also a bottom-gate thin film transistor, i.e., the organic semiconductor layer 32 is arranged at a side of the gate electrode 34 away from the base substrate 1, the source/drain electrode 31 is arranged between the organic semiconductor layer 32 and the gate electrode 34, and an organic gate insulation layer 33 is arranged between the gate electrode 34 and the source/drain electrode 31.

In a possible embodiment of the present disclosure, as shown in FIG. 1A and FIG. 2, an area of an orthogonal projection of the gate electrode 34 onto the base substrate 1 is less than an area of an orthogonal projection of the organic semiconductor layer 32 onto the base substrate 1, and the orthogonal projection of the gate electrode 34 onto the base substrate 1 is arranged within the orthogonal projection of the organic semiconductor layer 32 onto the base substrate 1. The area of the orthogonal projection of the organic semiconductor layer 32 onto the base substrate 1 is substantially equal to an area of an orthogonal projection of the organic gate insulation layer 33 onto the base substrate 1, and the orthogonal projection of the organic semiconductor layer 32 onto the base substrate 1 substantially coincides with the orthogonal projection of the organic gate insulation layer 33 onto the base substrate 1. To be specific, when the area of the orthogonal projection of the organic semiconductor layer 32 onto the base substrate 1 is substantially equal to the area of the orthogonal projection of the organic gate insulation layer 33 onto the base substrate 1, a ratio of the areas of the orthogonal projections is 1:0.8 to 1:1.2. To be specific, when the orthogonal projection of the organic semiconductor layer 32 onto the base substrate 1 substantially coincides with the orthogonal projection of the organic gate insulation layer 33 onto the base substrate 1, the orthogonal projections overlap with each other by 80% to 100%. In the embodiments of the present disclosure, the area of the orthogonal projection of the organic semiconductor layer 32 onto the base substrate 1 is substantially equal to the area of the orthogonal projection of the organic gate insulation layer 33 onto the base substrate 1, and the patterns are substantially the same, so during the manufacture, it is able to form the organic gate insulation layer 33 and the organic semiconductor layer 32 through a single dry etching process, thereby to simplify the manufacture of the display substrate.

In a possible embodiment of the present disclosure, as shown in FIG. 1A, the display substrate further includes a planarization layer 2 arranged between the organic thin film transistor 3 and the base substrate 1, and the planarization layer 2 is in direct contact with the organic protection layer 5 at the first hollowed-out structure 410. In the embodiments of the present disclosure, the planarization layer 2 is in direct contact with the organic protection layer 5 at the first hollowed-out structure 410, so as to improve the adhesion of the organic protection layer 5, thereby to prevent the organic protection layer 5 from being easily peeled off from the first electrode 41. To be specific, the material of the planarization layer 2 is a resin material without fluorine.

In a possible embodiment of the present disclosure, as shown in FIG. 1A, the planarization layer 2 includes a first planarization layer 21 and a second planarization layer 22 laminated one on another. The second planarization layer 22 is arranged at a side of the first planarization layer 21 away from the base substrate 1, and the second planarization layer 22 is in direct contact with the organic protection layer 5 at the first hollowed-out structure 410. To be specific, the first planarization layer 21 is made of a same material as the second planarization layer 22, the first planarization layer 21 is used for planarization and protecting the film layer below, and the second planarization layer 22 is used for flattening a shielding layer 7 between the first planarization layer 21 and the second planarization layer 22. To be specific, the first planarization layer 21 and the second planarization layer 22 may be made of different materials.

In a possible embodiment of the present disclosure, the display substrate includes a shielding layer 7 arranged between the first planarization layer 21 and the second planarization layer 22, the area of the orthogonal projection of the organic semiconductor layer 32 onto the base substrate 1 is less than an area of an orthogonal projection of the shielding layer 7 onto the base substrate 1, and the orthogonal projection of the organic semiconductor layer 32 onto the base substrate 1 is arranged within the orthogonal projection of the shielding layer 7 onto the base substrate 1. In the embodiments of the present disclosure, when the orthogonal projection of the organic semiconductor layer 32 onto the base substrate 1 is arranged within the orthogonal projection of the shielding layer 7 onto the base substrate 1, it is able to shield the organic semiconductor layer 32 through the shielding layer 7, thereby to prevent the performance of the original thin film transistor from being adversely affected by photo-generated carriers when the organic semiconductor layer 32 is irradiated by light.

In a possible embodiment of the present disclosure, a material of the shielding layer 7 includes metal or black resin.

In a possible embodiment of the present disclosure, the first electrode 41 is electrically coupled to the source/drain electrode 31, the first electrode 41 is a pixel electrode, the second electrode 42 is a common electrode, and the first electrode 41 is made of a same material as the second electrode 42. To be specific, both the first electrode 41 and the second electrode 42 are transparent electrodes. To be specific, the material of the first electrode 41 is ITO, zinc oxide, tin oxide, titanium oxide, or graphene.

Figure 12:
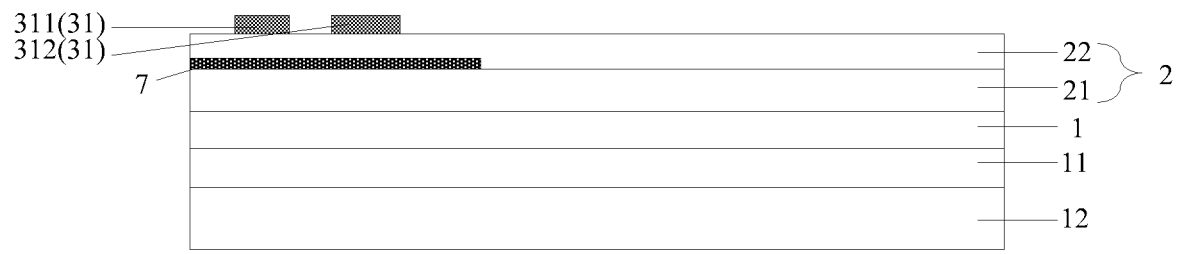
FIG. 12 is a sectional view of the display substrate after the formation of a source/drain electrode according to one embodiment of the present disclosure.
Figure 13:
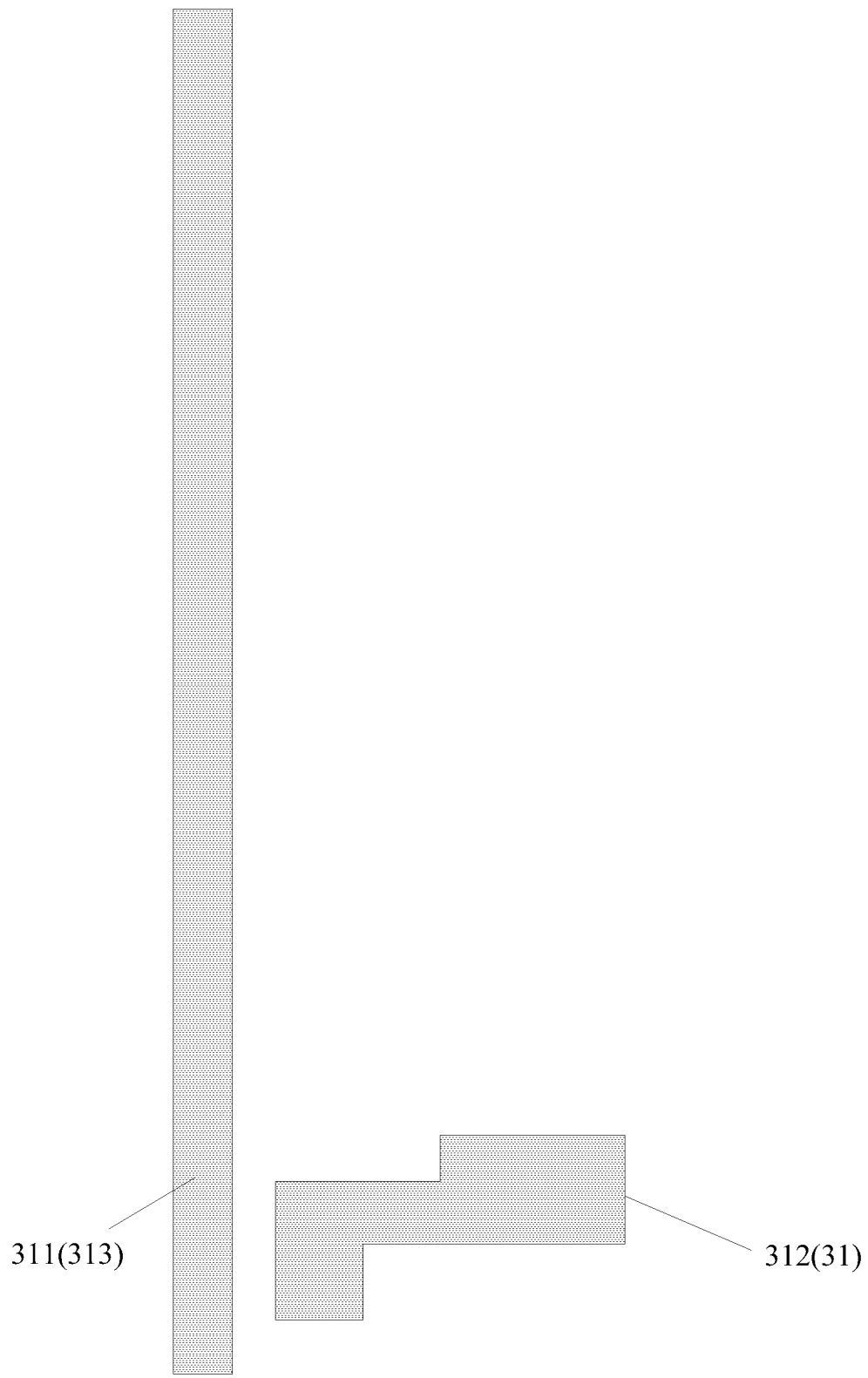
FIG. 13 is a top view of the source electrode and the drain electrode according to one embodiment of the present disclosure.

In a possible embodiment of the present disclosure, as shown in FIG. 2, FIG. 12 and FIG. 13, the source/drain electrode 31 includes a source electrode 311 and a drain electrode 312. The source electrode 311 is integrally coupled to a data line 313, and the drain electrode 312 is electrically coupled to the first electrode 41. An orthogonal projection of the data line 313 onto the base substrate 1 overlaps with the orthogonal projection of the second electrode 42 onto the base substrate 1.

In a possible embodiment of the present disclosure, the base substrate 1 is an organic flexible base substrate.

Figure 8:
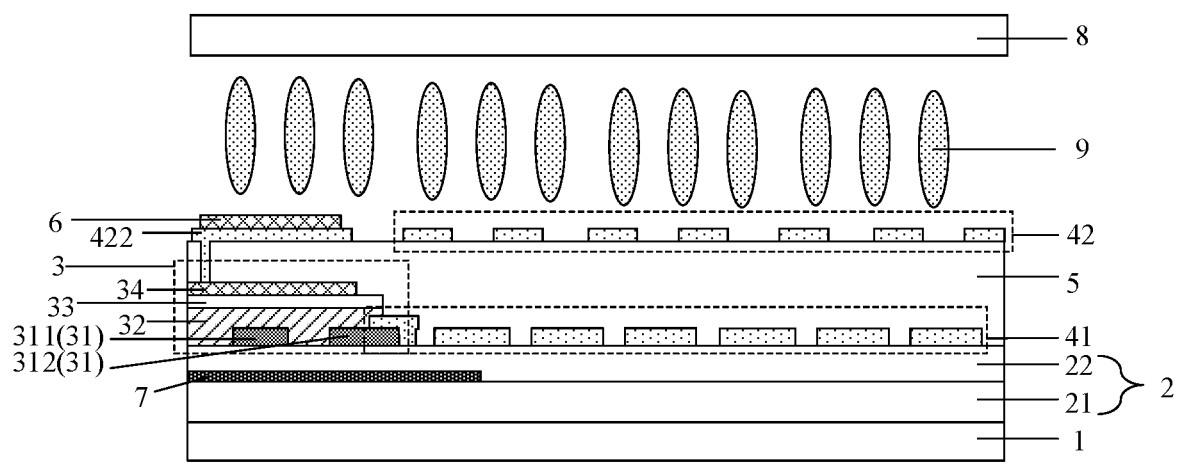
FIG. 8 is a sectional view of a display device according to one embodiment of the present disclosure.

As shown in FIG. 8, the present disclosure further provides in some embodiments a display device, which includes the above-mentioned display substrate, an opposite substrate 8 arranged opposite to the display substrate, and a liquid crystal layer 9 between the display substrate and the opposite substrate 8.

During the implementation, the display device further includes other structures, such as a sealant for sealing the opposite substrate 8 and the display substrate. The other structures may be provided according to the practical need, and thus will not be particularly defined herein.

Figure 9:
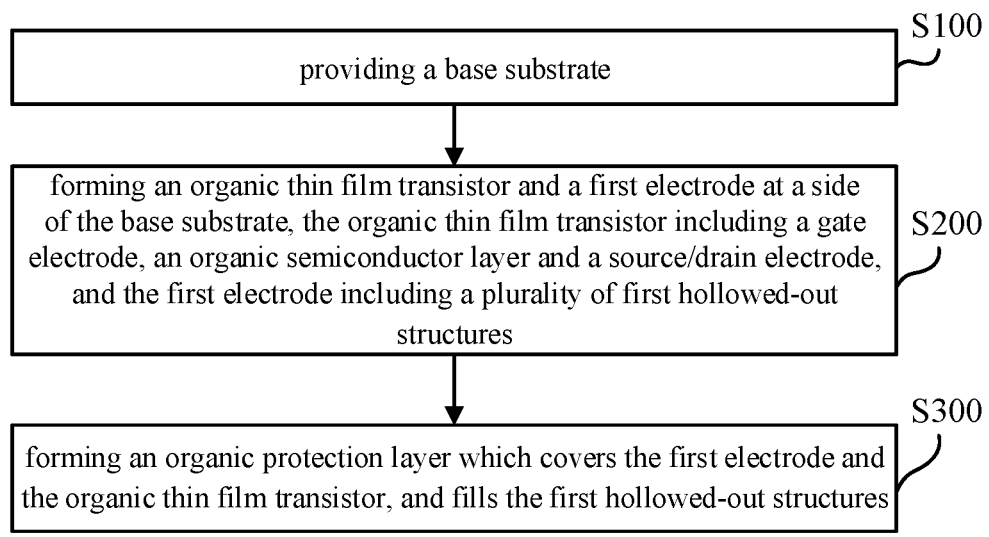
FIG. 9 is a flow chart of a method for manufacturing the display substrate according to one embodiment of the present disclosure.

As shown in FIG. 9, the present disclosure further provides in some embodiments a method for manufacturing a display substrate, which includes the following steps.

Step S100: providing a base substrate.

Step S200: forming an organic thin film transistor and a first electrode at a side of the base substrate, the organic thin film transistor including a gate electrode, an organic semiconductor layer and a source/drain electrode, and the first electrode including a plurality of first hollowed-out structures.

Step S300: forming an organic protection layer which covers the first electrode and the organic thin film transistor, and fills the first hollowed-out structures. To be specific, Step S300 includes: forming the organic protection layer which covers the first electrode and the organic thin film transistor and fills the first hollowed-out structures through spin coating; and UV-curing the organic protection layer and post-baking the organic protection layer at a temperature of 50° C. to 250° C.

Figure 10:
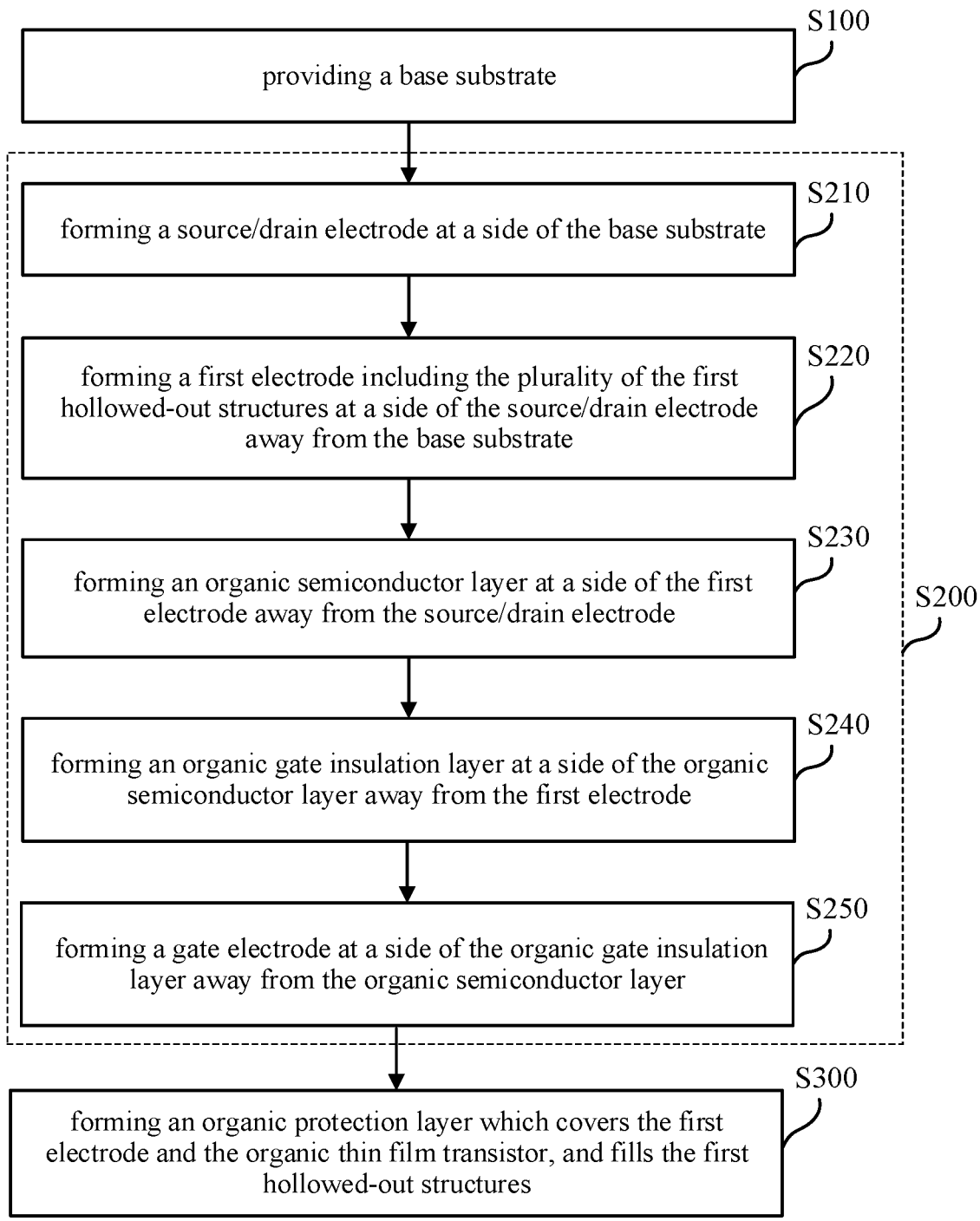
FIG. 10 is another flow chart of the method for manufacturing the display substrate according to one embodiment of the present disclosure.

In a possible embodiment of the present disclosure, as shown in FIG. 10, Step S200 of forming the organic thin film transistor and the first electrode at a side of the base substrate includes: Step S210 of forming a source/drain electrode at a side of the base substrate; Step S220 of forming the first electrode including the plurality of the first hollowed-out structures at a side of the source/drain electrode away from the base substrate; Step S230 of forming the organic semiconductor layer at a side of the first electrode away from the source/drain electrode; Step S240 of forming an organic gate insulation layer at a side of the organic semiconductor layer away from the first electrode; and Step S250 of forming the gate electrode at a side of the organic gate insulation layer away from the organic semiconductor layer.

Figure 11:
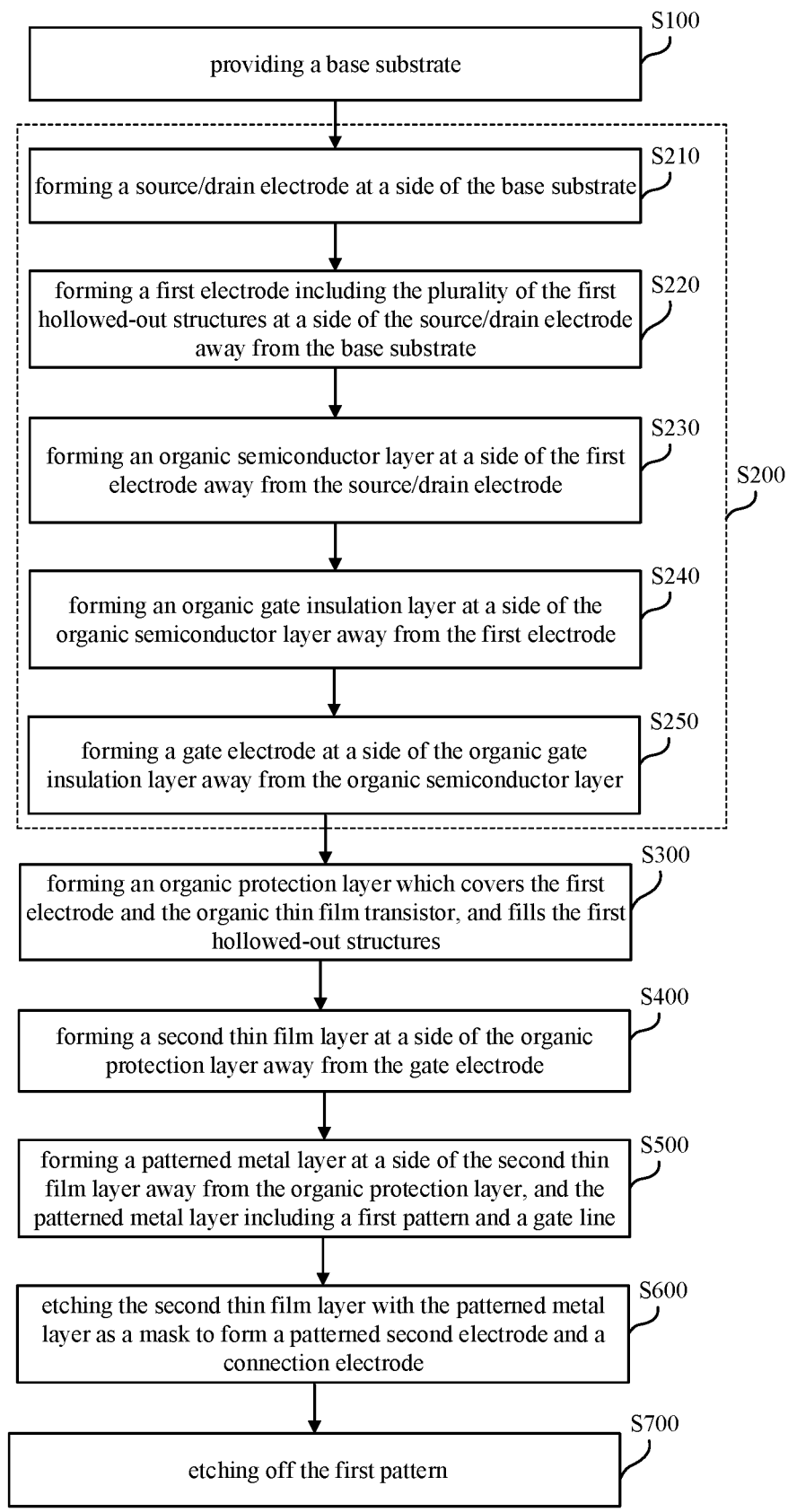
FIG. 11 is yet another flow chart of the method for manufacturing the display substrate according to one embodiment of the present disclosure.

In a possible embodiment of the present disclosure, as shown in FIG. 11, subsequent to Step S300 of forming the organic protection layer which covers the first electrode and the organic thin film transistor and fills the first hollowed-out structure, the method further includes the following steps.

Step S400: forming a second thin film layer at a side of the organic protection layer away from the gate electrode.

Step S500: forming a patterned metal layer at a side of the second thin film layer away from the organic protection layer, the patterned metal layer including a first pattern and a gate line. To be specific, the patterned metal layer is formed at a side of the second thin film layer away from the organic protection layer through a first wet etching process.

Step S600: etching the second thin film layer with the patterned metal layer as a mask to form a patterned second electrode and a connection electrode, a pattern of the second electrode being substantially the same as the first pattern, and a pattern of the connection electrode being substantially the same as a pattern of the gate line.

To be specific, the second thin film layer is etched with the patterned metal layer as a mask through a second wet etching process, so that an area of an orthogonal projection of the second electrode onto the base substrate is less than an area of an orthogonal projection of the first pattern onto the base substrate, the orthogonal projection of the second electrode onto the base substrate is arranged within the orthogonal projection of the first pattern onto the base substrate, an area of an orthogonal projection of the connection electrode onto the base substrate is less than an area of an orthogonal projection of the gate line onto the base substrate, and the orthogonal projection of the connection electrode onto the base substrate is arranged within the orthogonal projection of the gate line onto the base substrate.

Step S700: etching off the first pattern. To be specific, when etching off the first pattern, the method further includes etching a part of the gate line, so that the area of the orthogonal projection of the gate line onto the base substrate is less than the area of the orthogonal projection of the connection electrode onto the base substrate, and the orthogonal projection of the gate line onto the base substrate is arranged within the orthogonal projection of the connection electrode onto the base substrate.

The method will be described hereinafter in more details in conjunction with FIG. 12 to FIG. 25.

Step 1: providing a base substrate 1. To be specific, the base substrate 1 is a flexible organic base substrate. The base substrate 1 is attached onto a glass substrate 12 through an adhesive layer 11 to facilitate the formation of subsequent film layers. The glass substrate 12 and the adhesive layer 11 are peeled off from the base substrate 1 after the formation of the display substrate.

Step 2: forming the first planarization layer 21, the shielding layer 7 and the second planarization layer 22 in sequence at a side of the base substrate 1.

Step 3: forming the patterned source/drain electrode 31 at a side of the second planarization layer 22 away from the shielding layer 7. As shown in FIG. 12 and FIG. 13, the source/drain electrode 31 includes the source electrode 311 and the drain electrode 312, the source electrode 311 is integrally coupled to the data line 313, and the drain electrode 312 is electrically coupled to the first electrode 41 formed subsequently.

Figure 14:
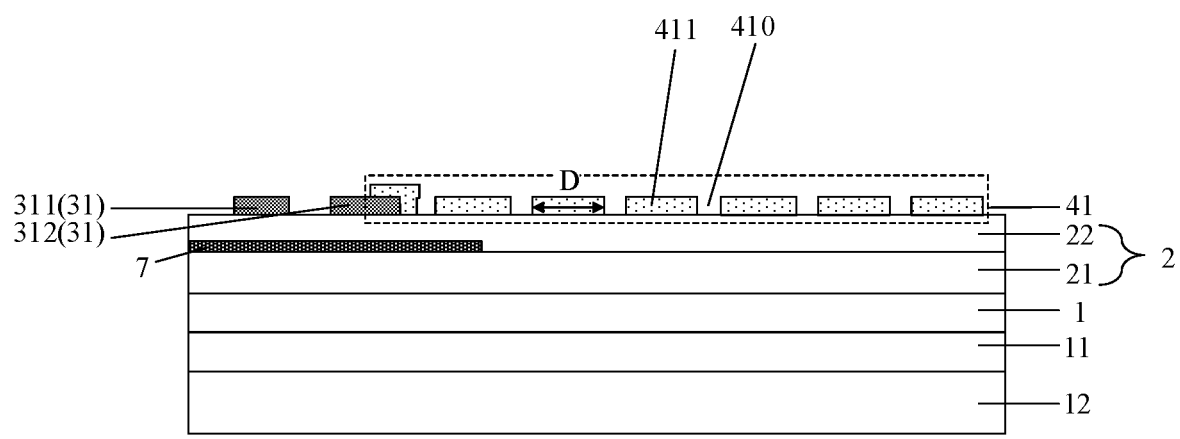
FIG. 14 is a sectional view of the display substrate after the formation of the first electrode according to one embodiment of the present disclosure.
Figure 15:
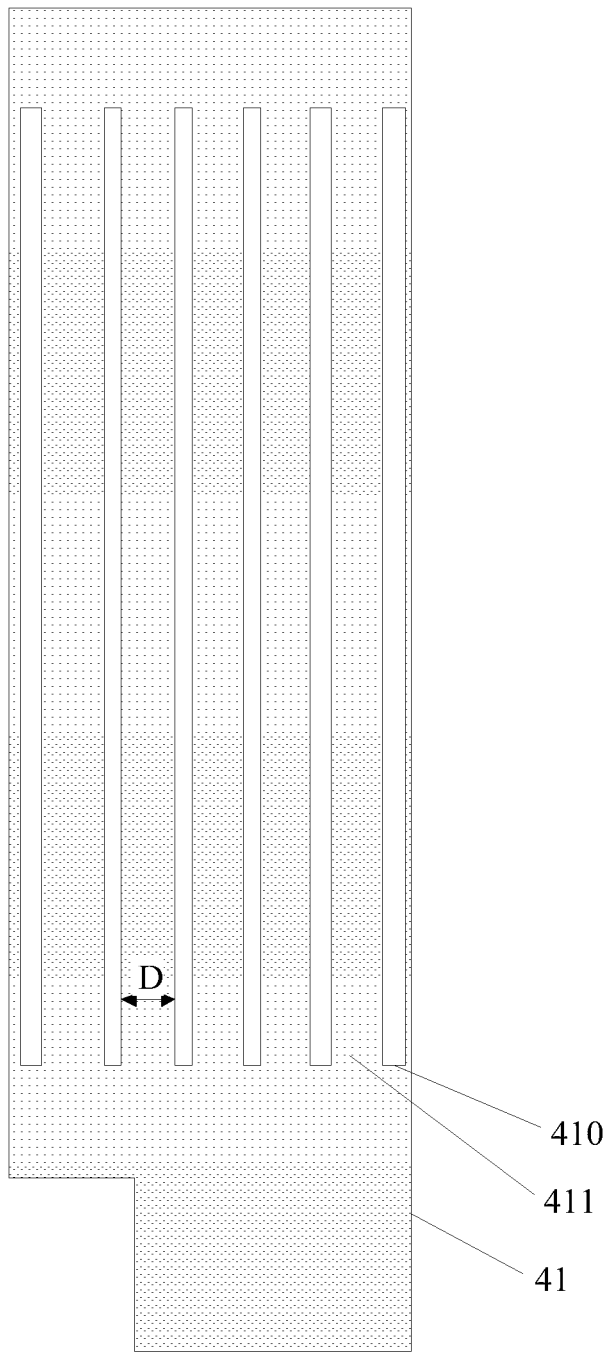
FIG. 15 is a top view of the first electrode according to one embodiment of the present disclosure.

Step 4: forming the first electrode 41 including the plurality of first hollowed-out structures 410 at a side of the source/drain electrode 31 away from the base substrate 1, as shown in FIG. 14 and FIG. 15. FIG. 15 shows a single film layer of the first electrode 41. To be specific, the first hollowed-out structure 410 accounts for 20% to 80%, e.g., 30% to 70%, 40% to 60%, 50%, 20% or 80%, of a total area of the first electrode 41.

As shown in FIG. 2, FIG. 4, FIG. 5 and FIG. 6, the first electrode 41 is of a finger-like pattern, and the first electrodes 41 and the finger-like second electrodes 42 are arranged alternately. A line width of the first electrode strip 411 in a direction parallel to a plane where the base substrate is located 1 and perpendicular to the first direction AB is D, and a width of the second hollowed-out structure 420 of the second electrode 42 in the direction parallel to the plane where the base substrate is located 1 and perpendicular to the first direction AB is S.

As shown in FIG. 5, when D>S, the active electric field is equivalent to that generated by the structure of the first electrode 41 in FIG. 6 without the finger pattern.

As shown in FIG. 4, when D<S, the active electric field is less than that generated by the structure of the first electrode 41 without the finger pattern, resulting so light efficiency is deteriorated.

Based on the above, the line width D of the finger pattern of the first electrode 41 needs to be greater than a line pitch S of the finger pattern of the second electrode 42, i.e., D>S.

Figure 16:
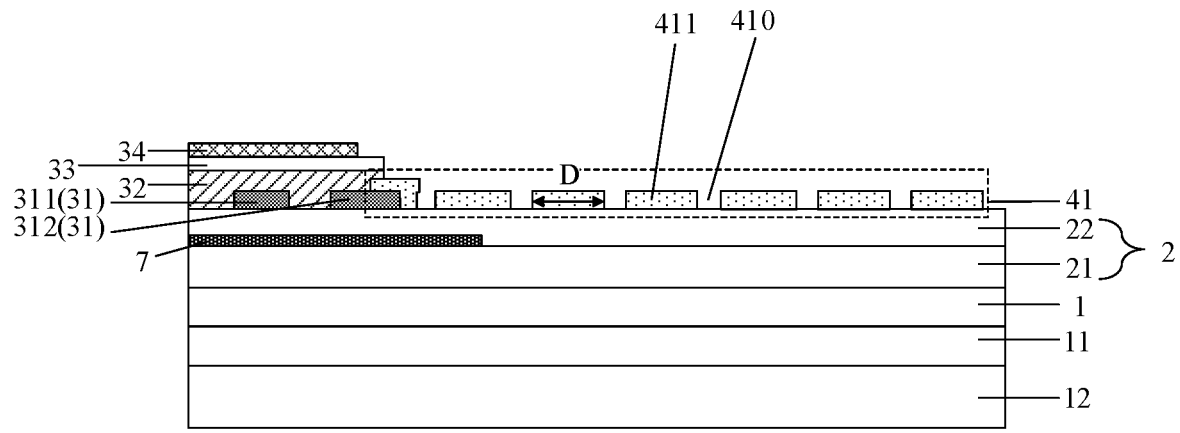
FIG. 16 is a sectional view of the display substrate after the formation of a gate electrode according to one embodiment of the present disclosure.
Figure 17:
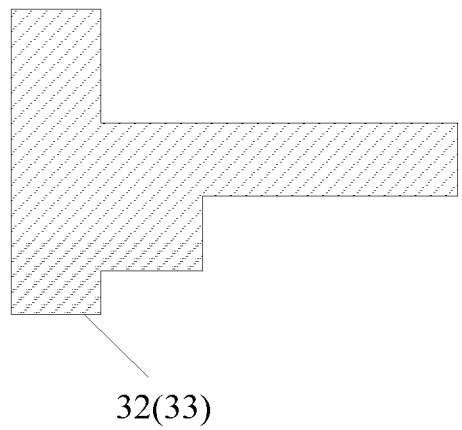
FIG. 17 is a top view of an organic semiconductor layer according to one embodiment of the present disclosure.
Figure 18:
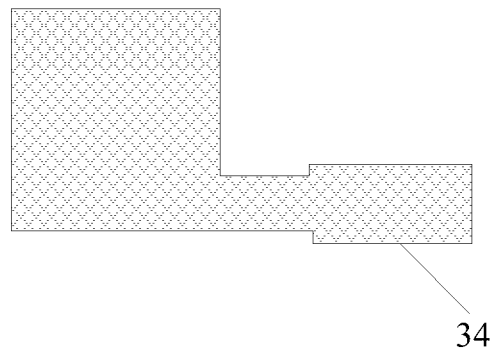
FIG. 18 is a top view of the gate electrode according to one embodiment of the present disclosure.

Step 5: as shown in FIG. 16, FIG. 17 and FIG. 18, forming the organic semiconductor layer 32 at a side of the first electrode 41 away from the source/drain electrode 31, forming the organic gate insulation layer 33 at a side of the organic semiconductor layer 32 away from the first electrode 41, and forming the gate electrode 34 at a side of the organic gate insulation layer 33 away from the organic semiconductor layer 32.

To be specific, the organic semiconductor film layer and the organic gate insulation film layer are formed in sequence, then the patterned gate electrode 34 is formed, and then the organic semiconductor film layer and the organic gate insulation film layer are patterned to form the organic semiconductor layer 32 and the organic gate insulation layer 33.

Step 6: forming an organic protection film layer.

Figure 19:
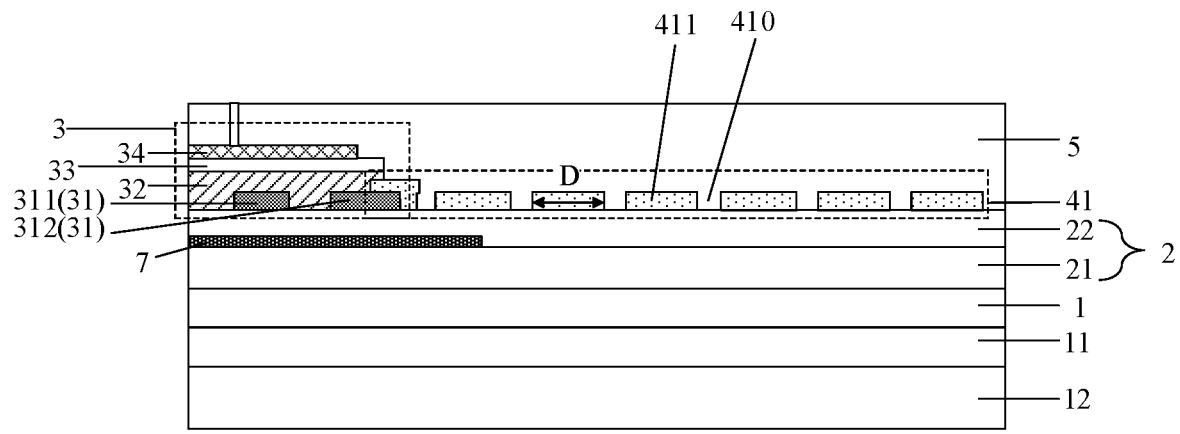
FIG. 19 is a sectional view of the display substrate after the formation of an organic protection layer according to one embodiment of the present disclosure.

Step 7: as shown in FIG. 19, patterning the organic protection film layer to form the organic protection layer 5 with a via hole for exposing a part of the gate electrode 34.

Figure 20:
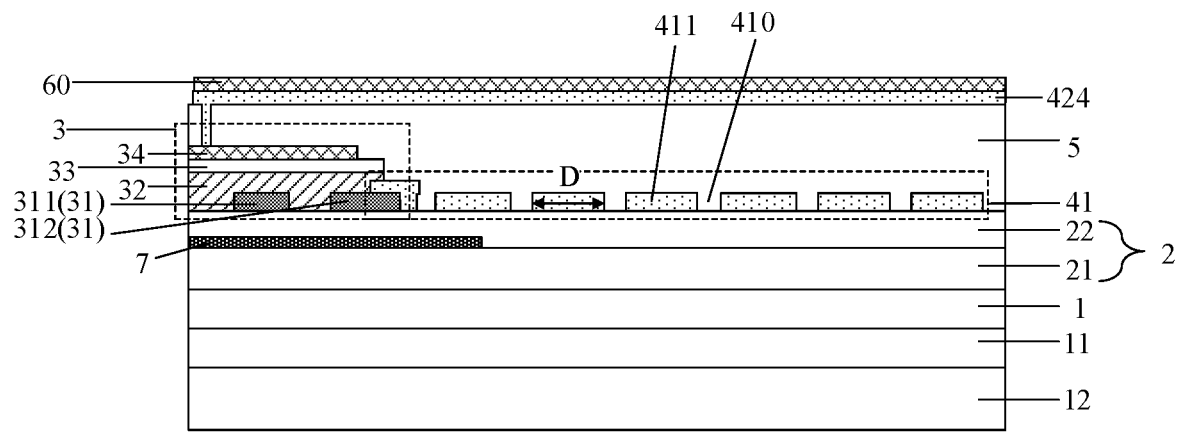
FIG. 20 is a sectional view of the display substrate after the formation of a metal thin film layer of the gate line according to one embodiment of the present disclosure.

Step 8: as shown in FIG. 20, depositing a second thin film layer 424 (a film layer for forming the second electrode 42) through sputtering.

Step 9: as shown in FIG. 20, depositing a gate line metal film layer 60 (a film layer for forming the gate line 6) through sputtering, and as shown in FIG. 21, forming a patterned metal layer at a side of the second thin film layer 424 away from the organic protection layer 5 through a first wet etching process. The patterned metal layer includes the first pattern 601 and the gate line 6.

Step 10: as shown in FIG. 21 and FIG. 22, etching the second thin film layer 424 with the patterned metal layer as a mask through a second wet etching process to form the patterned second electrode 42 and the connection electrode 422. The pattern of the second electrode 42 is substantially the same as the first pattern 601, and the pattern of the connection electrode 422 is substantially the same as the pattern of the gate line 6. In other words, the second wet etching process is performed on the second thin film layer 424 with the pattern in Step 10 as a mask after the first wet etching process.

To be specific, as shown in FIG. 22, the area of the orthogonal projection of the second electrode 42 onto the base substrate 1 is less than the area of the orthogonal projection of the first pattern 601 onto the base substrate 1, the orthogonal projection of the second electrode 42 onto the base substrate 1 is arranged within the orthogonal projection of the first pattern 601 onto the base substrate 1, the area of the orthogonal projection of the connection electrode 422 onto the base substrate 1 is less than the area of the orthogonal projection of the gate line 6 onto the base substrate 1, and the orthogonal projection of the connection electrode 422 onto the base substrate 1 is arranged within the orthogonal projection of the gate line 6 onto the base substrate 1.

When the first pattern 601 and the gate line 6 are used as a mask for the wet etching process, it is able to remarkably reduce the line width of the second electrode strip 421 through a low-temperature photolithography process.

Figure 24:
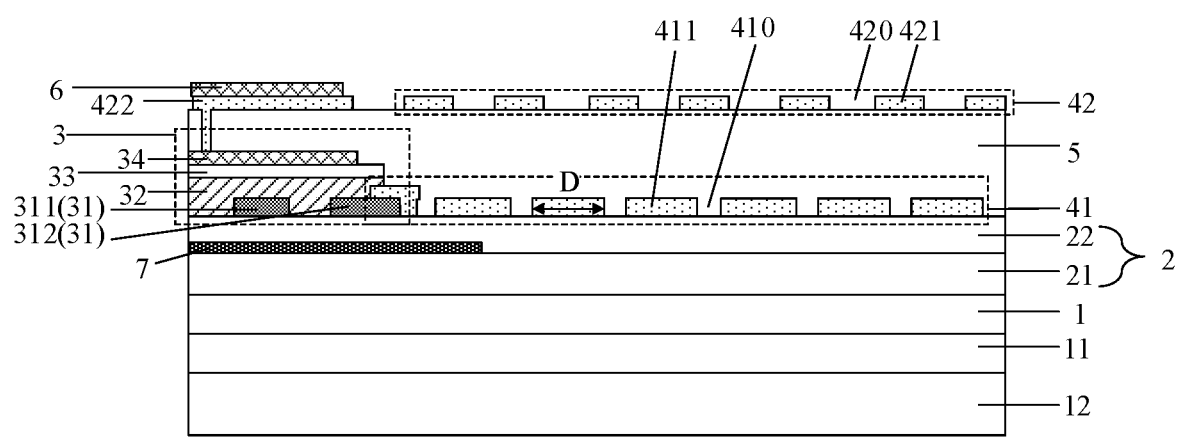
FIG. 24 is a sectional view of the display substrate after the removal of the first pattern according to one embodiment of the present disclosure.
Figure 25:
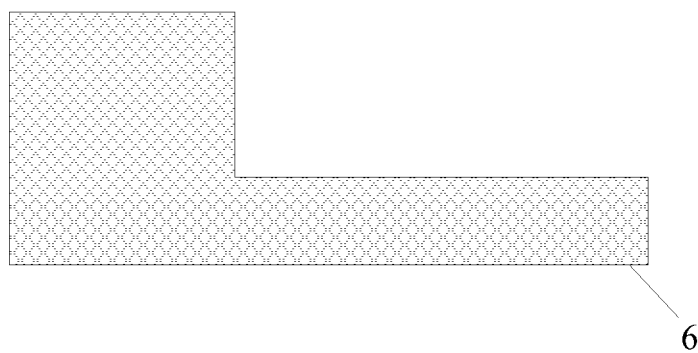
FIG. 25 is a top view of the gate line according to one embodiment of the present disclosure.

Step 11: as shown in FIG. 24 and FIG. 25, etching off the first pattern 601 and reserving the gate line 6 through a third wet etching process. To be specific, as shown in FIG. 24 and FIG. 25, when etching off the first pattern 60, the method further includes: etching a part of the gate line 6, so that the area of the orthogonal projection of the gate line 6 onto the base substrate 1 is less than the area of the orthogonal projection of the connection electrode 422 onto the base substrate 1, and the orthogonal projection of the gate line 6 onto the base substrate 1 is arranged within the orthogonal projection of the connection electrode 422 onto the base substrate 1.

According to the display substrate in the embodiments of the present disclosure, the first electrode 41 is provided with the plurality of first hollowed-out structures 410, the organic protection layer 5 covers the first electrode 41 and the organic thin film transistor 3 and fills the first hollowed-out structures 410, and the first electrode 41 has a concave-convex structure due to the plurality of first hollowed-out structures 410 of the first electrode 41. As a result, it is able to increase a surface roughness of the first electrode 41, reduce a proportion of the interface between the organic protection layer 5 and the inorganic first electrode 41, and increase the adhesion between the first electrode 41 and the organic protection layer 5, thereby to prevent the organic protection layer 5 from being separated from, or peeled off from, the first electrode 41.

Although the preferred embodiments are described above, a person skilled in the art may make modifications and alterations to these embodiments in accordance with the basic concept of the present disclosure. So, the attached claims are intended to include the preferred embodiments and all of the modifications and alterations that fall within the scope of the present disclosure.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a base substrate and a plurality of pixels arranged at a side of the base substrate, wherein each pixel comprises:

an organic thin film transistor comprising a gate electrode, an organic semiconductor layer, a source/drain electrode;

a first electrode comprising a plurality of first hollowed-out structures; and an organic protection layer covering the first electrode and the organic thin film transistor, and filling the first hollowed-out structure;

wherein the pixel comprises a second electrode arranged at a side of the organic protection layer away from the first electrode;

the first electrode comprises a plurality of first electrode strips extending in a first direction and electrically coupled to each other, and the first hollowed-out structure is arranged between adjacent first electrode strips;

the second electrode comprises a plurality of second electrode strips extending in the first direction and electrically coupled to each other, and a plurality of second hollowed-out structures each arranged between adjacent second electrode strips; and an area of an orthogonal projection of the second hollowed-out structure onto the base substrate is less than an area of an orthogonal projection of the first electrode strip onto the base substrate, and the orthogonal projection of the second hollowed-out structure onto the base substrate is arranged within the orthogonal projection of the first electrode strip onto the base substrate;

wherein the display substrate further comprises a gate line electrically coupled to the gate electrode and made of a material different from the gate electrode;

wherein the display substrate further comprises a connection electrode arranged at a same layer as, and insulated from, the second electrode, wherein the gate line is arranged at a side of the connection electrode away from the organic protection layer and is in contact with and electrically coupled to the connection electrode; and the connection electrode is electrically coupled to the gate electrode through a via hole, so that the gate line is electrically coupled to the gate electrode.

2. The display substrate according to claim 1, wherein the orthogonal projection of the first electrode strip onto the base substrate overlaps with an orthogonal projection of a part of the second electrode strip at a periphery of the second hollowed-out structure onto the base substrate.

3. The display substrate according to claim 2, wherein a line width of the first electrode strip in a direction parallel to a plane where the base substrate is located and perpendicular to the first direction is greater than a width of the second hollowed-out structure in the direction parallel to the plane where the base substrate is located and perpendicular to the first direction.

4. The display substrate according to claim 1, wherein a material of the gate line comprises molybdenum (Mo), and a material of the gate electrode comprises indium tin oxide (ITO) or indium gallium zinc oxide (IGZO).

5. The display substrate according to claim 1, wherein an area of an orthogonal projection of the gate line onto the base substrate is less than an area of an orthogonal projection of the connection electrode onto the base substrate, and the orthogonal projection of the gate line onto the base substrate is arranged within the orthogonal projection of the connection electrode onto the base substrate.

6. The display substrate according to claim 1, wherein a line width of the second electrode strip in a direction parallel to a plane where the base substrate is located and perpendicular to the first direction is from 1 µm to 5 µm.

7. The display substrate according to claim 1, wherein an area of an orthogonal projection of the first hollowed-out structure onto the base substrate accounts for 20% to 80% of an area of an orthogonal projection of the first electrode onto the base substrate.

8. The display substrate according to claim 1, wherein the organic semiconductor layer is arranged at a side of the source electrode and the drain electrode away from the base substrate, and the gate electrode is arranged at a side of the organic semiconductor layer away from the source electrode and the drain electrode; and
   an organic gate insulation layer is arranged between the gate electrode and the organic semiconductor layer.

9. The display substrate according to claim 8, wherein an area of an orthogonal projection of the gate electrode onto the base substrate is less than an area of an orthogonal projection of the organic semiconductor layer onto the base substrate, and the orthogonal projection of the gate electrode onto the base substrate is arranged within the orthogonal projection of the organic semiconductor layer onto the base substrate; and
   the area of the orthogonal projection of the organic semiconductor layer onto the base substrate is substantially equal to an area of an orthogonal projection of the organic gate insulation layer onto the base substrate, and the orthogonal projection of the organic semiconductor layer onto the base substrate substantially coincides with the orthogonal projection of the organic gate insulation layer onto the base substrate.

10. The display substrate according to claim 1, wherein the organic semiconductor layer is arranged at a side of the gate electrode away from the base substrate, and the source/drain electrode is arranged between the organic semiconductor layer and the gate electrode; and
   an organic gate insulation layer is arranged between the gate electrode and the source/drain electrode.

11. The display substrate according to claim 1, further comprising:
   a planarization layer arranged between the organic thin film transistor and the base substrate, wherein the planarization layer is in direct contact with the organic protection layer at the first hollowed-out structure, the planarization layer comprising a first planarization layer and a second planarization layer laminated one on another, the second planarization layer is arranged at a side of the first planarization layer away from the base substrate, and the second planarization layer is in direct contact with the organic protection layer at the first hollowed-out structure; and
   a shielding layer arranged between the first planarization layer and the second planarization layer, wherein the area of the orthogonal projection of the organic semiconductor layer onto the base substrate is less than an area of an orthogonal projection of the shielding layer onto the base substrate, and the orthogonal projection of the organic semiconductor layer onto the base substrate is arranged within the orthogonal projection of the shielding layer onto the base substrate,
   wherein a material of the shielding layer comprises metal or black resin.

12. The display substrate according to claim 1, wherein the first electrode is electrically coupled to the source electrode and the drain electrode, the first electrode is a pixel electrode, the second electrode is a common electrode, the first electrode is made of a same material as the second electrode, and the base substrate is an organic flexible base substrate, and
   wherein a material of the first electrode comprises ITO or IGZO.

13. A display device, comprising:
   the display substrate according to claim 1;
   an opposite substrate arranged opposite to the display substrate; and
   a liquid crystal layer between the display substrate and the opposite substrate.

\* \* \* \* \*